(12) United States Patent
Kubo et al.

(10) Patent No.: US 6,737,928 B2
(45) Date of Patent: May 18, 2004

(54) TEMPERATURE-COMPENSATED CRYSTAL OSCILLATOR

(75) Inventors: Kuichi Kubo, Saitama (JP); Fumio Asamura, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/205,999

(22) Filed: Jul. 26, 2002

(65) Prior Publication Data

US 2003/0020556 A1 Jan. 30, 2003

(30) Foreign Application Priority Data

Jul. 30, 2001 (JP) ........................................ 2001-229827

(51) Int. Cl.[7] ................................................ H03B 5/32
(52) U.S. Cl. ........................................ 331/158; 331/176
(58) Field of Search .............................. 331/158, 116 R, 331/176, 177; 327/512, 513

(56) References Cited

U.S. PATENT DOCUMENTS

| | | | | |
|---|---|---|---|---|
| 5,745,012 A | * | 4/1998 | Oka et al. ...................... | 331/68 |
| 6,040,744 A | * | 3/2000 | Sakurai et al. ............... | 331/176 |
| 2001/0052826 A1 | | 12/2001 | Kubo et al. .................. | 331/116 |

FOREIGN PATENT DOCUMENTS

| | | | | |
|---|---|---|---|---|
| JP | 62-090006 | * | 4/1987 | ............ H03B/5/32 |
| JP | 2001-044758 | | 2/2001 | |

OTHER PUBLICATIONS

U.S. patent application Ser. No. 10/201,467, Kubo et al., filed Jul. 23, 2002.

* cited by examiner

*Primary Examiner*—Linh M. Nguyen
(74) *Attorney, Agent, or Firm*—Katten Muchin Zavis Rosenman

(57) ABSTRACT

A temperature-compensated crystal oscillator with good phase noise characteristics has a crystal unit, a voltage-variable capacitive element inserted in a closed oscillating loop including the crystal unit, and an amplifier for keeping oscillation in the closed oscillating loop. The frequency vs. temperature characteristics of the temperature-compensated crystal oscillator can be compensated for by the temperature compensating voltage input thereto. The temperature compensating voltage is applied to an anode of the voltage-variable capacitive element, and a voltage to prevent a current from flowing through the voltage-variable capacitive element is applied to a cathode of the voltage-variable capacitive element. The voltage-variable capacitive element preferably comprises a variable-capacitance diode.

10 Claims, 5 Drawing Sheets

TEMPERATURE-COMPENSATED CRYSTAL OSCILLATOR

BACKGROUND OF THE INVENTION

1. Field of the Invention

The present invention relates to a temperature-compensated crystal oscillator (TCXO), and more particularly to a temperature-compensated crystal oscillator with reduced phase noise.

2. Description of the Related Art

Temperature-compensated crystal oscillators are used as a reference frequency source in mobile communication devices such as cellular phone terminals or the like, for example, because they are capable of compensating for the frequency vs. temperature characteristics thereof due to the crystal unit for increased frequency stability. In recent years, there has been a demand for a temperature-compensated crystal oscillator with reduced phase noise for the purpose of maintaining desired communication quality in digital communications.

FIG. 1 shows a circuit arrangement of a conventional temperature-compensated crystal oscillator. As shown in FIG. 1, the conventional temperature-compensated crystal oscillator generally comprises a crystal oscillator and a temperature compensating mechanism, which are integrated in an IC (integrated circuit) chip. The crystal oscillator has crystal unit 1 as an inductor and a pair of voltage-variable capacitive elements 2a, 2b connected respectively to the opposite ends of crystal unit 1, the voltage-variable capacitive elements 2a, 2b doubling as oscillating capacitors. Crystal unit 1 comprises, for example, an AT-cut quartz-crystal blank whose frequency vs. temperature characteristics is represented by a cubic curve nearly at the room temperature. Each of voltage-variable capacitive elements 2a, 2b typically comprises a variable-capacitance diode. Voltage-variable capacitive elements 2a, 2b and crystal unit 1 jointly make up a resonance circuit. Voltage-variable capacitive elements 2a, 2b have respective anodes connected to a ground potential as a reference potential and respective cathodes to which there is applied a temperature compensating voltage $V_c$ via respective resistors 6a, 6b which serve to cut off high frequency components.

Inverting amplifier 4 with feedback resistor 3 connected thereacross is connected across crystal unit 1 for amplifying the resonance frequency component of the resonance circuit. Inverting amplifier 4 should preferably comprise a CMOS (Complementary Metal Oxide Semiconductor) inverter. DC-blocking capacitors 5a, 5b are provided respectively to input and output terminals of inverting amplifier 4. The temperature-compensated crystal oscillator produces an output voltage $V_o$ from the junction between capacitor 5b and crystal unit 1. The temperature-compensated crystal oscillator may be summarized as a crystal oscillator with voltage-variable capacitive elements 2a, 2b inserted in its closed oscillation loop. The frequency vs. temperature characteristics of the crystal oscillator is represented by a cubic curve because of the characteristics of the crystal unit.

The temperature compensating mechanism generates a low-level detected-temperature signal in response to the ambient temperature based on, for example, the temperature vs. resistance characteristics of a resistor in the IC chip, and generates the temperature compensating voltage $V_c$ from a constant voltage source based on or amplifying the detected-temperature signal. As shown in FIG. 2, the temperature compensating voltage $V_c$ has temperature vs. voltage characteristics having a reference voltage $V_{co}$ at 25° C., which corresponds to the frequency vs. temperature characteristics of the crystal oscillator, and is represented by a cubic curve superposed on the reference voltage $V_{co}$. Various circuits for generating the temperature compensating voltage $V_c$ are known to those skilled in the art.

When the temperature compensating voltage $V_c$ from the temperature compensating mechanism is applied to the cathodes of voltage-variable capacitive elements 2a, 2b, the capacitances across these voltage-variable capacitive elements change. Since the equivalent series capacitance as viewed from crystal unit 1 also changes, a change in the frequency vs. temperature characteristics of the crystal oscillator can be compensated for and the frequency vs. temperature characteristics can be made flat by thus applying the temperature compensating voltage $V_c$ which corresponds to the frequency vs. temperature characteristics of the crystal oscillator.

The temperature compensating voltage $V_c$ is of a positive potential to apply a reverse voltage to the cathodes of voltage-variable capacitive elements 2a, 2b, so that the capacitances across voltage-variable capacitive elements 2a, 2b will be reduced in inverse proportion to the applied voltage. That is, the capacitances across voltage-variable capacitive elements 2a, 2b are changed by the reverse voltage applied thereto, with no current flowing between the anodes and cathodes of voltage-variable capacitive elements 2a, 2b.

However, the above crystal oscillator suffers the following problems by applying the temperature compensating voltage $V_c$ to the cathodes of voltage-variable capacitive elements 2a, 2b. As shown in FIG. 3, the output signal $V_o$ of the temperature-compensated crystal oscillator has a waveform represented by a high-frequency voltage superposed on the temperature compensating voltage $V_c$. The waveform of the output signal $V_o$ has an upper limit $V_{max}$ and a lower limit $V_{min}$. In order to keep the cathode of the voltage-variable capacitive element positive with respect to the anode thereof, the lower limit $V_{min}$ of the output signal $V_o$ has to be greater than the potential (0 V in FIG. 3) of the anode. Therefore, the temperature compensating voltage $V_c$ which is typified by the reference voltage $V_{co}$ needs to be of a value depending on the amplitude level of the output signal, i.e., a value with the half value $(V_{max}+V_{min})/2$ of the amplitude level being added as an offset voltage thereto. However, as described above, the temperature compensating voltage $V_c$ is generated from the constant voltage source based on or amplifying the low-level detected-temperature signal according to the temperature vs. resistance characteristics of the resistor. The voltage signal generated by the constant voltage source generally contains more noise as the voltage value thereof is higher. Consequently, since the conventional temperature-compensated crystal oscillator needs to set the temperature compensating voltage $V_c$ (or the reference voltage $V_{co}$) to a higher value depending on the output signal thereof, the output signal contains large noise, deteriorating the phase noise characteristics of the temperature-compensated crystal oscillator.

SUMMARY OF THE INVENTION

It is therefore an object of the present invention to provide a temperature-compensated crystal oscillator with good phase noise characteristics.

According to the present invention, the above object can be achieved by a temperature-compensated crystal oscillator comprising a crystal unit having frequency vs. temperature characteristics, a voltage-variable capacitive element inserted in a closed oscillation loop including the crystal unit, an amplifier for keeping oscillation in the closed oscillating loop, means for applying a temperature compensating voltage to an anode of the voltage-variable capacitive element, and means for applying a voltage to prevent a current from flowing through the voltage-variable capacitive element to a cathode of the voltage-variable capacitive element, whereby the frequency vs. temperature characteristics can be compensated for by the temperature compensating voltage applied to the anode of the voltage-variable capacitive element.

Because the temperature compensating voltage is applied to the anode of the voltage-variable capacitive element, the voltage applied to the cathode of the voltage-variable capacitive element is relatively increased to apply a reverse voltage to the voltage-variable capacitive element, thus preventing a direct current from flowing through the voltage-variable capacitive element. As a result, the temperature compensating voltage can be set to a desired value without having to take into account the amplitude level of a high-frequency output voltage (oscillated output) of the temperature-compensated crystal oscillator. Since it is not necessary to add an offset voltage $(V_{max}+V_{min})/2$ to the temperature compensating voltage and hence the temperature compensating voltage can be lowered, noise contained in the temperature compensating voltage can be reduced. As a result, the phase noise characteristics of the temperature-compensated crystal oscillator is maintained at a good level.

DETAILED DESCRIPTION OF THE INVENTION

Figure 1:
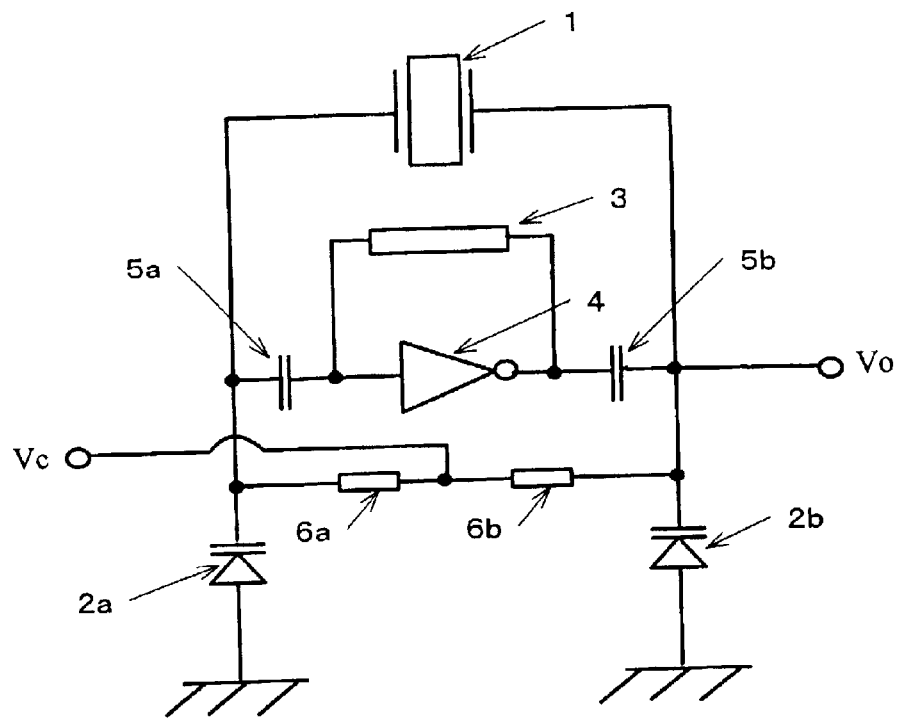
FIG. 1 is a circuit diagram of a conventional temperature-compensated crystal oscillator.
Figure 4:
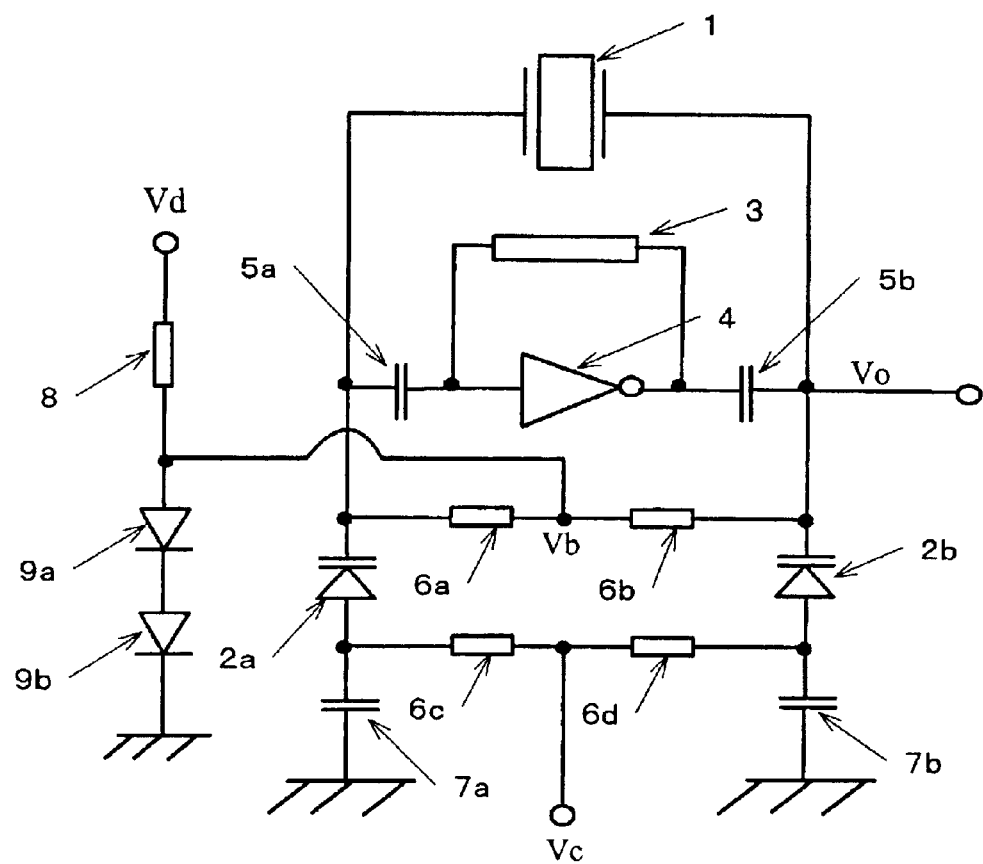
FIG. 4 is a circuit diagram of a temperature-compensated crystal oscillator according to an embodiment of the present invention.

FIG. 4 shows a temperature-compensated crystal oscillator according to an embodiment of the present invention. Those parts of the temperature-compensated crystal oscillator shown in FIG. 4 which are identical to those of the conventional temperature-compensated crystal oscillator shown in FIG. 1 are denoted by identical reference characters, and will not be described in detail below.

The temperature-compensated crystal oscillator shown in FIG. 4 has voltage-variable capacitive elements 2a, 2b inserted in the closed oscillating loop of a crystal oscillator which comprises crystal unit 1 and an inverting amplifier 4 with feedback resistor 3 connected thereacross. Specifically, the temperature-compensated crystal oscillator shown in FIG. 4 differs from the temperature-compensated crystal oscillator shown in FIG. 1 in that capacitors 7a, 7b are inserted between voltage-variable capacitive elements 2a, 2b and the ground, and the temperature compensating voltage $V_c$ is applied to the anodes of voltage-variable capacitive elements 2a, 2b via respective resistors 6c, 6d which serve to cut off high frequency components. A fixed voltage $V_b$, rather than the temperature compensating voltage $V_c$, is applied to the cathodes of voltage-variable capacitive elements 2a, 2b via respective resistors 6a, 6b. Capacitors 7a, 7b, which serve as DC-blocking capacitors, are inserted in the closed oscillating loop. Therefore, capacitors 7a, 7b are required to have respective capacitances selected such that the equivalent series capacitance of the circuit as viewed from crystal unit 1 is of an appropriate value.

Figure 2:
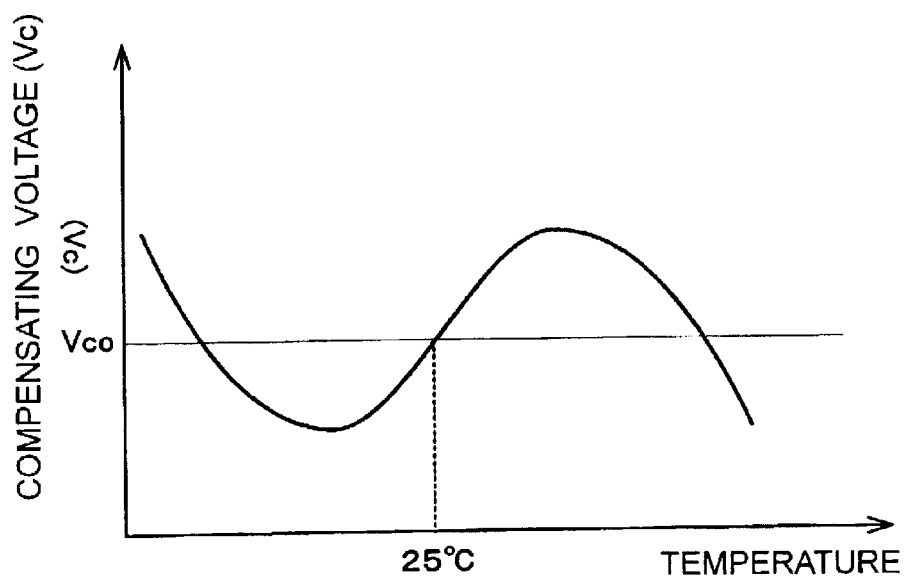
FIG. 2 is a graph showing the relationship between the ambient temperature and the temperature compensating voltage.
Figure 3:
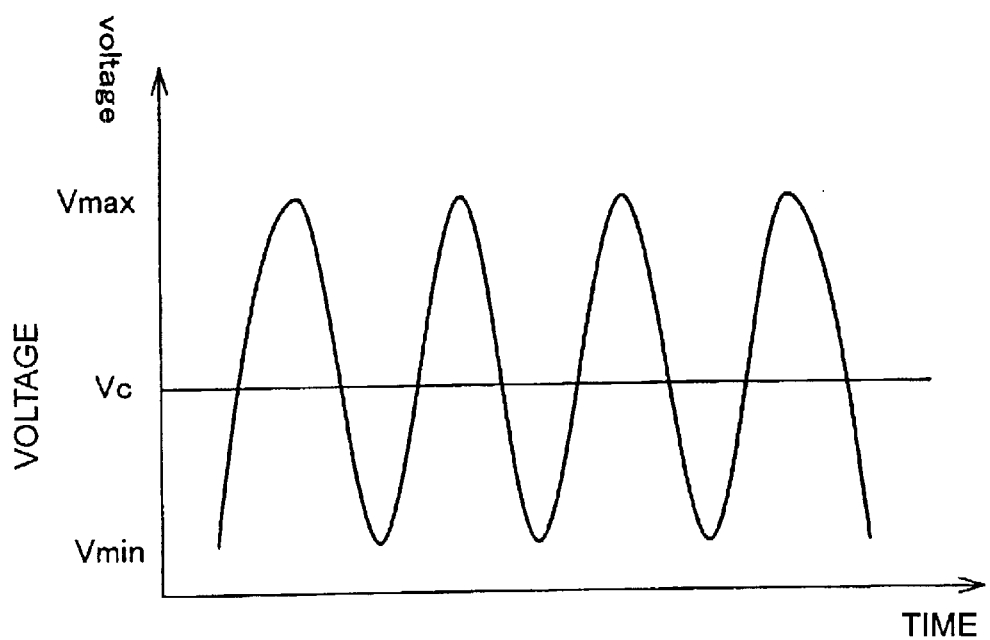
FIG. 3 is a diagram showing the waveform of an oscillation output signal from the conventional temperature-compensated crystal oscillator.

The temperature compensating voltage $V_c$ which is applied to the anode of voltage-variable capacitive elements 2a, 2b comprises a voltage represented by a cubic curve which compensates for the frequency vs. temperature characteristics of crystal unit 1, superposed on the reference voltage $V_{co}$, as with the voltage shown in FIG. 2. The fixed voltage $V_b$ applied to the cathodes of voltage-variable capacitive elements 2a, 2b comprises a voltage which is higher than the sum of at least the upper limit of the temperature compensating voltage $V_c$ and the half value $(V_{max}+V_{min})/2$ of the amplitude level of the oscillated output high-frequency voltage, i.e., the offset voltage. A series-connected circuit of resistor 8 and two diodes 9a, 9b is inserted between constant voltage source $V_d$ and the ground. The fixed voltage $V_b$ is extracted from the junction between resistor 8 and diode 9a.

With the above arrangement, since the temperature compensating voltage $V_c$ is applied to the anode of voltage-variable capacitive elements 2a, 2b, the value of the temperature compensating voltage $V_c$ can be made smaller than if it were applied to the cathodes of voltage-variable capacitive elements 2a, 2b. Specifically, since it is not necessary to add the offset voltage $(V_{max}+V_{min})/2$ when a reverse voltage is applied to the cathodes of voltage-variable capacitive elements 2a, 2b, the temperature compensating voltage $V_c$ (reference value $V_{co}$) can be smaller by the offset voltage $(V_{max}+V_{min})/2$, and hence the noise produced when the temperature compensating voltage $V_c$ is generated from the constant voltage source can be reduced.

The fixed voltage $V_b$ applied to the cathodes of voltage-variable capacitive elements 2a, 2b is generated by the constant voltage source $V_d$ and the series-connected circuit of resistor 8 and diodes 9a, 9b. Specifically, a voltage (0.7 V×2) corresponding to the forward voltage drop across diodes 9a, 9b is produced as the fixed voltage $V_b$. As disclosed in Japanese laid-open patent publication No. 2001-44758 (JP, P2001-44758A), because a noise component generated by constant voltage source $V_d$ flows through diodes 9a, 9b into the reference potential (ground potential), the fixed voltage $V_b$ does not contain the noise component. While the fixed voltage $V_b$ of 1.4 V is produced by the two series-connected diodes in the present embodiment, a desired value of the fixed voltage $V_b$ may be obtained by increasing or reducing the number of series-connected diodes.

With the circuit shown in FIG. 4, a voltage which is free of a noise component is applied as the fixed voltage $V_b$ to the cathodes of voltage-variable capacitive elements 2a, 2b, and the temperature compensating voltage $V_c$ is applied to the anodes of voltage-variable capacitive elements 2a, 2b. Inasmuch as the offset voltage $(V_{max}+V_{min})/2$ is not added to the temperature compensating voltage $V_c$, the value of temperature compensating voltage $V_c$ (reference value $V_{co}$) may be reduced, thus reducing any noise component. Therefore, the phase noise characteristics of the temperature-compensated crystal oscillator is improved.

The principles of the present invention are also applicable to a voltage-controlled temperature-compensated crystal oscillator.

Figure 5:
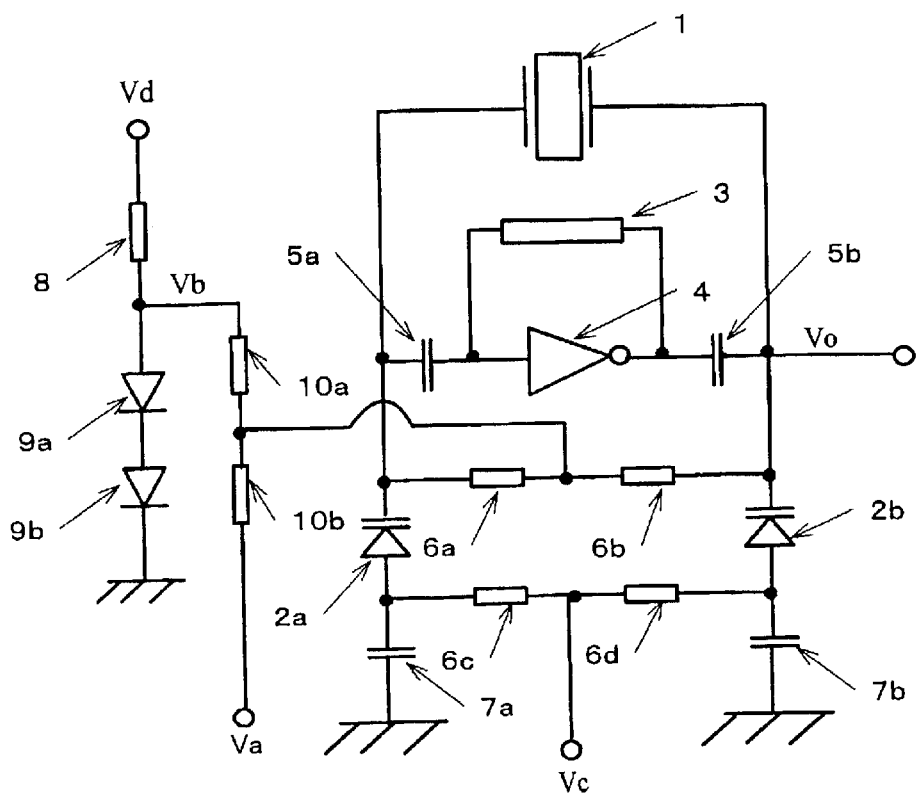
FIG. 5 is a circuit diagram of a temperature-compensated crystal oscillator according to another embodiment of the present invention.

A temperature-compensated crystal oscillator according to a second embodiment of the present invention shown in FIG. 5 is supplied with a frequency control voltage $V_a$ as well as the temperature compensating voltage $V_c$, and functions as a voltage-controlled temperature-compensated crystal oscillator. The temperature-compensated crystal oscillator shown in FIG. 5 differs from the temperature-compensated crystal oscillator shown in FIG. 4 in that resistor 10a is inserted between the junction between resistor 8 and diode 9a and a midpoint between resistors 6a, 6b, and a frequency control voltage $V_a$ is applied through resistor 10b to the midpoint between resistors 6a, 6b. The frequency control voltage $V_a$ is supplied from, for example, an automatic frequency control (AFC) circuit mounted on a wiring board on which the temperature-compensated crystal oscillator is carried. If the AFC circuit is incorporated in a cellular phone terminal, then the AFC circuit receives a reference signal from a base station, and the reference oscillation frequency, i.e., the oscillation frequency at normal temperature, of the temperature-compensated crystal oscillator is controlled by the frequency control voltage $V_a$ which is generated by the AFC circuit in response to the received reference signal.

In the circuit shown in FIG. 5, resistors 10 a, 10b serves as a voltage divider, and a frequency control voltage produced by the voltage divider is applied via resistors 6a, 6b to the cathodes of voltage-variable capacitive elements 2a, 2b. The frequency control voltage $V_a$ is determined depending on the specifications of the user, and is divided in order to fall within the rated value of voltage-variable capacitive elements 2a, 2b. The minimum value of the divided frequency control voltage is selected to be higher than the sum of the upper limit of the temperature compensating voltage $V_c$ and the offset voltage $(V_{max}+V_{min})/2$ in view of the contribution from the fixed voltage $V_b$.

With the circuit shown in FIG. 5, the temperature compensating voltage $V_c$ is applied to the anodes of voltage-variable capacitive elements 2a, 2b, and the frequency control voltage $V_a$ with the offset voltage $(V_{max}+V_{min})/2$ added thereto is applied to the cathodes of voltage-variable capacitive elements 2a, 2b, thus applying a reverse voltage to voltage-variable capacitive elements 2a, 2b. The value of the temperature compensating voltage $V_c$ can be made smaller by the offset voltage than if the temperature compensating voltage $V_c$ is applied to the cathodes of voltage-variable capacitive elements 2a, 2b. Therefore, any noise component produced when the temperature compensating voltage $V_c$ (reference value $V_{co}$) is generated is reduced, and hence the phase noise characteristics of the temperature-compensated crystal oscillator is improved.

In each of the above embodiments, the voltage applied to the cathodes of voltage-variable capacitive elements 2a, 2b is equal to or higher than the sum of the upper limit of the temperature compensating voltage and the offset voltage. If variable-capacitance diodes are used as the voltage-variable capacitive elements, then the voltage-variable capacitive elements cause a forward voltage drop $V_t$ of about 0.7 V, for example, and no current flows between the anodes and cathodes thereof even when a forward voltage lower than the range of the forward voltage drop is applied to the cathodes of voltage-variable capacitive elements. Actually, therefore, the voltage applied to the cathodes of voltage-variable capacitive elements 2a, 2b is selected to be equal to or higher than a voltage whose value is represented by the difference between the sum of the upper limit of the temperature compensating voltage and the offset voltage and the forward voltage drop $V_t$.

While the forward voltage drop across each of diodes 9a, 9b used to generate the fixed voltage $V_b$ has been described as having a value of about 0.7 V, that value is obtained at a temperature of 25° C. Actually, the forward voltage drop across each of diodes 9a, 9b has some temperature-dependent characteristics. If a frequency change due to such temperature-dependent characteristics cannot be ignored, then the temperature-dependent characteristics of crystal unit 1 may be compensated for in advance by changing the angle at which the crystal blank is cut off a bulk quartz-crystal block.

In the above description, voltage-variable capacitive elements 2a, 2b are connected to the respective ends of crystal unit 1. However, only one voltage-variable capacitive element may be connected to one of the ends of crystal unit 1. While CMOS inverting amplifier 4 is used to satisfy the oscillating conditions in the illustrated embodiments, it may instead comprise an amplifier using bipolar transistors. While a forward voltage drop across the diodes is used as the fixed voltage $V_b$ to reduce noise in the above embodiments, the fixed voltage $V_b$ may be generated by a chemical cell or battery which produces a constant voltage containing small noise. However, use of the diodes in the illustrated embodiments is advantageous for the purpose of reducing the size of the temperature-compensated crystal oscillator because the fixed voltage $V_b$ can be generated within the IC chip.

While preferred embodiments of the present invention have been described using specific terms, such description is for illustrative purposes only, and it is to be understood that changes and variations may be made without departing from the spirit or scope of the following claims.

What is claimed is:

1. A temperature-compensated crystal oscillator comprising:
   a crystal unit having frequency vs. temperature characteristics;
   a voltage-variable capacitive element inserted in a closed oscillating loop including said crystal unit;
   an amplifier for keeping oscillation in said closed oscillation loop;
   means for applying a temperature compensating voltage to an anode of said voltage-variable capacitive element; and
   means for applying a voltage to prevent a current from flowing through said voltage-variable capacitive element to a cathode of said voltage-variable capacitive element;
   whereby said frequency vs. temperature characteristics can be compensated for by the temperature compensating voltage applied to the anode of said voltage-variable capacitive element,
   said temperature compensating voltage being generated by a voltage source different from at least one voltage source generating said voltage to prevent a current from flowing through said voltage-variable capacitive element.

2. A temperature-compensated crystal oscillator comprising:
   a crystal unit having frequency vs. temperature characteristics;
   a voltage-variable capacitive element inserted in a closed oscillating loop including said crystal unit;

an amplifier for keeping oscillation in said closed oscillation loop;

means for applying a temperature compensating voltage to an anode of said voltage-variable capacitive element: and means for applying a voltage to prevent a current from flowing through said voltage-variable capacitive element to a cathode of said voltage-variable capacitive element;

whereby said frequency vs. temperature characteristics can be compensated for by the temperature compensating voltage applied to the anode of said voltage-variable capacitive element, wherein said anode is connected to a reference potential point through a capacitor and said cathode is connected to said crystal unit.

3. A temperature-compensated crystal oscillator comprising:

a crystal unit having frequency vs. temperature characteristics;

a voltage-variable capacitive element inserted in a closed oscillating loop including said crystal unit;

an amplifier for keeping oscillation in said closed oscillation loop;

means for applying a temperature compensating voltage to an anode of said voltage-variable capacitive element; and means for applying a voltage to prevent a current from flowing through said voltage-variable capacitive element to a cathode of said voltage-variable capacitive element;

whereby said frequency vs. temperature characteristics can be compensated for by the temperature compensating voltage applied to the anode of said voltage-variable capacitive element, wherein said anode is connected to a reference potential point through a capacitor and said cathode is connected to said crystal unit, and wherein said reference potential point comprises a ground point.

4. A temperature-compensated crystal oscillator comprising:

a crystal unit having frequency vs. temperature characteristics;

a voltage-variable capacitive element inserted in a closed oscillating loop including said crystal unit;

an amplifier for keeping oscillation in said closed oscillation loop;

means for applying a temperature compensating voltage to an anode of said voltage-variable capacitive element; and means for applying a voltage to prevent a current from flowing through said voltage-variable capacitive element to a cathode of said voltage-variable capacitive element;

whereby said frequency vs. temperature characteristics can be compensated for by the temperature compensating voltage applied to the anode of said voltage-variable capacitive element, wherein said anode is connected to a reference potential point through a capacitor and said cathode is connected to said crystal unit, and wherein said voltage-variable capacitive element comprises a variable-capacitance diode.

5. A temperature-compensated crystal oscillator comprising:

a crystal unit having frequency vs. temperature characteristics;

a voltage-variable capacitive element inserted in a closed oscillating loop including said crystal unit;

an amplifier for keeping oscillation in said closed oscillation loop;

means for applying a temperature compensating voltage to an anode of said voltage-variable capacitive element; and means for applying a voltage to prevent a current from flowing through said voltage-variable capacitive element to a cathode of said voltage-variable capacitive element;

whereby said frequency vs. temperature characteristics can be compensated for by the temperature compensating voltage applied to the anode of said voltage-variable capacitive element, wherein said anode is connected to a reference potential point through a capacitor and said cathode is connected to said crystal unit, and wherein said means for applying a voltage comprises a series-connected circuit of a resistor connected to a constant voltage source and at least one diode connected between said resistor and said reference potential point, and said voltage to prevent a current from flowing through said voltage-variable capacitive element is extracted from the junction between said resistor and said at least one diode.

6. A temperature-compensated crystal oscillator comprising:

a crystal unit having frequency vs. temperature characteristics;

a voltage-variable capacitive element inserted in a closed oscillating loop including said crystal unit;

an amplifier for keeping oscillation in said closed oscillation loop;

means for applying a temperature compensating voltage to an anode of said voltage-variable capacitive element; and means for applying a voltage to prevent a current from flowing through said voltage-variable capacitive element to a cathode of said voltage-variable capacitive element;

whereby said frequency vs. temperature characteristics can be compensated for by the temperature compensating voltage applied to the anode of said voltage-variable capacitive element, wherein said voltage to prevent a current from flowing through said voltage-variable capacitive element is equal to or greater than the sum of an upper limit of said temperature compensating voltage and a half value of an amplitude level of an oscillated output from the temperature-compensated crystal oscillator.

7. A temperature-compensated crystal oscillator comprising:

a crystal unit having frequency vs. temperature characteristics;

a voltage-variable capacitive element inserted in a closed oscillating loop including said crystal unit;

an amplifier for keeping oscillation in said closed oscillation loop;

means for applying a temperature compensating voltage to an anode of said voltage-variable capacitive element; and means for applying a voltage to prevent a current from flowing through said voltage-variable capacitive element to a cathode of said voltage-variable capacitive element;

whereby said frequency vs. temperature characteristics can be compensated for by the temperature compensating voltage applied to the anode of said voltage-variable capacitive element, wherein said voltage to prevent a current from flowing through said voltage-variable capacitive element is equal to or greater than a voltage which is represented by the difference between the sum of an upper limit of said temperature compensating voltage and a half value of the amplitude level of an oscillated output from the temperature-compensated crystal oscillator and a forward voltage drop across said voltage-variable capacitive element.

8. A temperature-compensated crystal oscillator comprising:

a crystal unit having frequency vs. temperature characteristics;

a voltage-variable capacitive element inserted in a closed oscillating loop including said crystal unit;

an amplifier for keeping oscillation in said closed oscillation loop;

means for applying a temperature compensating voltage to an anode of said voltage-variable capacitive element; and means for applying a voltage to prevent a current from flowing through said voltage-variable capacitive element to a cathode of said voltage-variable capacitive element;

whereby said frequency vs. temperature characteristics can be compensated for by the temperature compensating voltage applied to the anode of said voltage-variable capacitive element, wherein said voltage to prevent a current from flowing through said voltage-variable capacitive element comprises a fixed voltage to which there is added a frequency control voltage supplied from an automatic frequency control circuit.

9. The temperature-compensated crystal oscillator according to claim 8, wherein said means for applying a voltage comprises a series-connected circuit of a resistor connected to a constant voltage source and at least one diode connected between said resistor and said reference potential point, and said fixed voltage is extracted from the junction between said resistor and said at least one diode.

10. A temperature-compensated crystal oscillator comprising:

a crystal unit having frequency vs. temperature characteristics;

a voltage-variable capacitive element inserted in a closed oscillating loop including said crystal unit;

an amplifier for keeping oscillation in said closed oscillation loop;

means for applying a temperature compensating voltage to an anode of said voltage-variable capacitive element; and means for applying a voltage to prevent a current from flowing through said voltage-variable capacitive element to a cathode of said voltage-variable capacitive element;

whereby said frequency vs. temperature characteristics can be compensated for by the temperature compensating voltage applied to the anode of said voltage-variable capacitive element, wherein said voltage-variable capacitive element comprises a pair of voltage-variable capacitive elements connected to respective ends of said crystal unit.

* * * * *